United States Patent [19]

Sato et al.

[11] Patent Number: 5,756,255
[45] Date of Patent: May 26, 1998

[54] UNDERCOATING COMPOSITION FOR PHOTOLITHOGRAPHY

[75] Inventors: Mitsuru Sato; Katsumi Oomori; Kiyoshi Ishikawa, all of Kanagawa-ken; Etsuko Iguchi, Tokyo-to; Toshimasa Nakayama, Kanagawa-ken, all of Japan

[73] Assignee: Tokyo Ohka Kogyo Co., Ltd., Japan

[21] Appl. No.: 747,567

[22] Filed: Nov. 12, 1996

Related U.S. Application Data

[63] Continuation of Ser. No. 500,593, Jul. 11, 1995, abandoned.

[30] Foreign Application Priority Data

Jul. 18, 1994 [JP] Japan .................................. 6-165663
Feb. 28, 1995 [JP] Japan .................................. 7-040523

[51] Int. Cl.$^6$ .................................. G03F 7/004; G03C 1/825
[52] U.S. Cl. .................. 430/270.1; 430/158; 430/160; 430/271.1; 430/272.1; 430/510; 430/512; 430/916; 430/923
[58] Field of Search .................. 430/270.1, 510, 430/512, 916, 923, 271.1, 272.1, 158, 160

[56] References Cited

U.S. PATENT DOCUMENTS

| 4,889,789 | 12/1989 | Stahlhofen | 430/191 |
| 4,910,122 | 3/1990 | Arnold et al. | 430/313 |
| 5,008,175 | 4/1991 | Hsieh et al. | 430/191 |
| 5,077,173 | 12/1991 | Schultz et al. | 430/191 |
| 5,089,373 | 2/1992 | Uenishi et al. | 430/191 |
| 5,234,990 | 8/1993 | Flaim et al. | 524/609 |
| 5,294,680 | 3/1994 | Knors et al. | 525/327.4 |

FOREIGN PATENT DOCUMENTS

| 0542008A1 | 5/1993 | European Pat. Off. |
| 63-138353 | 6/1988 | Japan . |
| 3-67261 | 10/1991 | Japan . |
| 6-35201 | 2/1994 | Japan . |
| 6-69124 | 3/1994 | Japan . |

*Primary Examiner*—John S. Chu
*Attorney, Agent, or Firm*—Wenderoth, Lind & Ponack

[57] ABSTRACT

Proposed is a novel undercoating composition used in the photolithographic patterning of a photoresist layer by intervening between the substrate surface and the photoresist layer to decrease the adverse influences of the reflecting light from the substrate surface. The undercoating composition of the invention comprises (a) a melamine compound substituted by methylol groups and/or alkoxymethyl groups and (b) a polyhydroxy benzophenone compound, diphenyl sulfone compound or diphenyl sulfoxide compound, optionally, with admixture of (c) an alkali-insoluble resin of a (meth)acrylic acid ester.

8 Claims, No Drawings

UNDERCOATING COMPOSITION FOR PHOTOLITHOGRAPHY

This application is a continuation of now abandoned application, Ser. No. 08/500,593, filed Jul. 11, 1995.

BACKGROUND OF THE INVENTION

The present invention relates to an undercoating composition for photolithography or, more particularly, relates to a novel undercoating composition for photolithography used for forming an undercoating layer on the surface of a substrate with an object to decrease the reflecting light from the substrate surface which may cause adverse influences on the quality of patterning in the overcoating photoresist layer on the undercoating layer. In particular, the invention provides an undercoating composition from which an undercoating layer can be formed between the substrate surface and the overcoating photoresist layer without the problems of undesirable phenomena of intermixing and notching and capable of exhibiting excellent crosslinkability by heating with a large selectivity ratio to give a patterned resist layer with high fidelity to the mask pattern.

One of the difficult problems in the photolithographic patterning work is that, when the substrate surface has a high reflectivity of light as is the case with a substrate surface of aluminum, tungsten silicide and the like or when the substrate surface has a step-wise level difference to cause irregular reflection of light, the fidelity of patterning in the photoresist layer relative to the mask pattern is adversely affected by the irregular reflection of light from the substrate surface or by the influences of standing waves so that the patterned images sometimes suffer from a decrease in the dimensional accuracy of the pattern or local distortion or the so-called phenomenon of notching.

The above described problem relative to the light reflection from the substrate surface is becoming more and more serious in recent years along with the progress in the semiconductor technology in which the wavelength of the light for the photolithographic patterning is shorter and shorter than heretofore with a trend of transition to the use of short-wavelength ultraviolet light such as i-line of 365 nm wavelength, far-ultraviolet light, excimer laser beams and the like as the major current. With such a short-wavelength ultraviolet light, the troubles due to reflection of light from the substrate surface are not limited to the high-reflectivity surfaces mentioned above and stepped surfaces but are caused even from conventional substrate surface such as a silicon oxide-coated surface having no particular high-reflectivity or no level differences.

Various proposals and attempts have of course been made heretofore in order to mitigate the disadvantages such as decrease in the dimensional accuracy of patterning or the phenomenon of notching due to light reflection from the substrate surface, if not completely removed. An approach in this regard is the so-called ARC (anti-reflective coating) method to provide a reflection-preventing layer intervening as an undercoating layer between the substrate surface and the photoresist layer. Various undercoating compositions have been proposed for this purpose.

For example, Japanese Patent Kokai 59-93448 proposes an undercoating composition for forming a reflection-preventing layer containing a resinous ingredient with admixture of an ultraviolet absorbing agent. The resinous ingredient there proposed, however, is limited to a polyamic acid and poly-butene sulfonic acid so that the undercoating layer formed from such a composition has low adhesion to the substrate surface sometimes to cause exfoliation or occurrence of residues or scums in the patterning procedure.

Japanese Patent Publication 3-67261 and Japanese Patent Kokai 63-138353 disclose an undercoating composition having improved adhesion to the substrate surface which comprises a resin obtained by the condensation reaction between a diphenylamine compound and a melamine compound and a light-absorptive compound having a light-absorption band in the same wavelength region as for the photosensitizing agent contained in the photoresist layer. Further, Japanese Patent Kokai 6-35201 proposes an undercoating composition comprising a copolymeric resin of glycidyl methacrylate and methyl methacrylate and an ultraviolet-absorbing agent. Japanese Patent Kokai 6-69124 proposes use of a poly(vinyl α-cyanoacetate) as the principal ingredient in the undercoating composition and Japanese Patent Kokai 6-75378 proposes use of a copolymeric resin of maleic anhydride and a monomer having an ethylenically unsaturated double bond in the molecule in a reflection-preventing undercoating composition.

The above described undercoating compositions in the prior art commonly have several defects because the miscibility of the resinous ingredient and the ultraviolet-absorbing agent is not always high enough so that the compounding amount of the latter ingredient in the composition is limited and, if the compounding amount thereof is too large, intermixing is caused between layers so that the reflection-preventing effect is greatly decreased and, as a consequence, the fidelity of the patterned resist layer to the mask pattern cannot be high enough not to comply with the requirement for the increasingly high degree of integration in the modern electronic technology. This problem is still more serious because the selectivity ratio, which is the ratio of the thickness reduction of the undercoating layer in an etching treatment to the thickness reduction of the resist layer in the same etching treatment, exhibited by these prior art undercoating compositions can not always be high enough while a high fidelity of patterning and good working efficiency cannot be accomplished without a high selectivity ratio.

U.S. Pat. No. 5,234,990 discloses a reflection-preventing undercoating composition for deep ultraviolet light using a polysulfone resin or a polyurea sulfone resin as the principal ingredient. A very serious problem has been found in the photolithographic patterning by using such an undercoating composition that an undesirable phenomenon of undercutting takes place in the bottom of the resist layer at the interface with the undercoating layer eventually resulting in sideway falling of the patterned resist layer.

Japanese Patent Kokai 6-118631 proposes a reflection-preventing undercoating composition comprising a phenolic resin such as novolac resins and a thermal crosslinking agent therefor such as a melamine-formaldehyde resin. As an inherency of the novolac resins, the etching resistance of the reflection-preventing layer formed from such a composition is so high that, in the dry etching process to remove the undercoating layer after patterning of the resist layer, the selectivity ratio cannot be high with a large thickness reduction of the resist layer in order to completely remove the undercoating layer. Further, the thermal crosslinkability of the melamine-formaldehyde resin as the thermal crosslinking agent is not so high that a fully crosslinked undercoating layer can be obtained only by a heat treatment at a relatively high temperature for an unduly long time resulting in low productivity against the requirement for high throughput in the manufacture of semiconductor devices.

SUMMARY OF THE INVENTION

The present invention accordingly has an object to provide a novel and improved reflection-preventing undercoating composition for use in the photolithographic patterning works of a photoresist layer by being interposed between the substrate surface and the photoresist layer without the problems and disadvantages in the prior art compositions such as intermixing between layers and notching and capable of exhibiting high thermal crosslinkability to give a high selectivity ratio in etching.

Thus, the reflection-preventing undercoating composition of the invention is a uniform mixture in the form of a solution in an organic solvent which comprises:

(a) a triazine compound, such as melamine compounds and guanamine compounds, having, in a molecule, at least two functional groups capable of forming crosslinking by heating or irradiation with actinic rays selected from the group consisting of hydroxy group and alkoxy groups; and (b) an ultraviolet-absorbing compound represented by the general formula

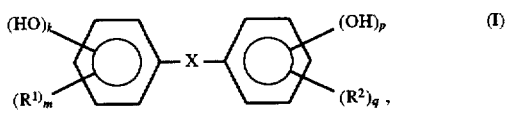

in which X is a divalent group selected from the group consisting of —CO—, —SO— and —SO$_2$—, $R_1$ and $R^2$ are, each independently from the other, a hydrogen atom, halogen atom or alkyl group having 1 to 4 carbon atoms, alkoxy group having 1 to 8 carbon atoms, the subscripts k, m and q are each an integer of 1, 2 or 3 and the subscript p is 0, 1, 2 or 3 with the proviso that k+m and p+q each do not exceed 5.

It is sometimes advantageous that the inventive undercoating composition further contains, besides the above defined components (a) and (b), an additional component (c) which is a polymer of a (meth)acrylic acid ester or a copolymer of (meth)acrylic acid esters as an alkali-insoluble resin.

DETAILED DESCRIPTION OF THE PREFERRED EMBODIMENTS

As is described above, the inventive undercoating composition comprises, as the essential ingredients, a specific crosslinkable triazine compound as the component (a) and a highly ultraviolet-absorbing compound as the component (b) including benzophenone compounds, diphenyl sulfoxide compounds and diphenyl sulfone compounds in a specified proportion.

The component (a) in the inventive composition is a triazine compound capable of forming crosslinks between the component (b) and/or the optional ingredient of the component (c) by heating. The crosslinkable functional group in the triazine compound include a hydroxy group in the form of a methylol group and alkoxy groups in the form of an alkoxymethyl group. The triazine compound, i.e. substituted melamine compound or guanamine compound, which can be in the form of a dimer or trimer, is represented by the general formula

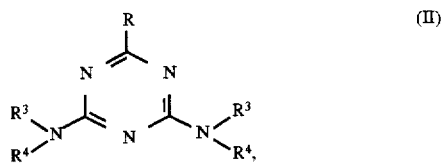

in which R is a monovalent atom or group selected from the group consisting of a hydrogen atom, alkyl group, aralkyl group, aryl group and the group of the formula —NR$^3$R$^4$ and $R_1$ and R$^4$ are, each independently from the others, a monovalent atom or group selected from the group consisting of a hydrogen atom, methylol group and alkoxymethyl groups, at least two of the groups denoted by R$^3$ and R$^4$ in a molecule being methylol groups or alkoxymethyl groups or, preferably, from 3 to 5.8 of the groups denoted by R$^3$ and R$^4$ in a molecule on an average per triazine ring being methylol groups or alkoxymethyl groups. When the number of the methylol groups or alkoxymethyl groups in a molecule is 6, an adverse influence is caused on the crosslinkability of the composition by heating or actinic ray irradiation.

These hydroxymethylated or alkoxymethylated triazine compounds can be readily prepared according to a known method in which melamine or guanamine is reacted in boiling water with formalin to effect hydroxymethylation or further by the alkoxylation reaction of the methylol groups with a lower alcohol. Various commercial grades of such compounds are available on the market and can be used as such including those sold under the tradenames of Mx-750 and Mw-30 (each a product by Sanwa Chemical Co.) which are each a melamine compound substituted by methoxymethyl groups in a degree of substitution of 3.7 and 5.8, respectively, per triazine ring on an average.

The component (b) in the inventive undercoating composition is a highly ultraviolet-absorbing compound and is required to have high absorptivity to the light in the wavelength region corresponding to the region of the photosensitivity of the photosensitive ingredient in the photoresist composition from which the photoresist layer is formed on the undercoating layer. When this requirement is satisfied, the undercoating layer serves to prevent the adverse effects due to the reflection of light from the substrate surface on the quality of the photolithographic patterning in the resist layer by the influences of standing waves or irregular reflection from the stepped substrate surface.

Accordingly, various compounds can be used as the component (b) as selected from those conventionally used in the prior art undercoating compositions including salicylate compounds, benzophenone compounds, diphenyl sulfoxide compounds, diphenyl sulfone compounds, benzotriazole compounds, cyanoacrylate compounds, azo compounds, polyene compounds, anthraquinone compounds and the like.

Among the above named classes of the highly ultraviolet absorbing compounds, particularly preferable are the benzophenone compounds, diphenyl sulfoxide compounds and diphenyl sulfone compounds represented by the general formula

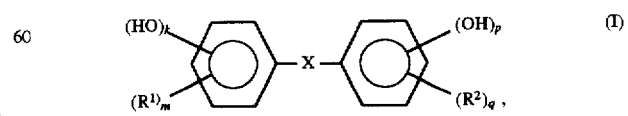

in which X is a divalent group selected from the group consisting of —CO—, —SO— and —SO$_2$—, R$^1$ and R$^2$ are, each independently from the other, a hydrogen atom, halogen atom, alkyl group having 1 to 4 carbon atoms or alkoxy group having 1 to 8 carbon atoms, the subscripts k, m and q are each an integer of 1, 2 or 3 and the subscript p is 0, 1, 2 or 3 with the proviso that k+m and p+q each do not exceed 5.

The ultraviolet-absorbing compound of the general formula (I), in which the divalent group X is —CO—, is a polyhydroxy-benzophenone compound, preferably, exemplified by 2,2',4,4'-tetrahydroxy benzophenone, 2-hydroxy-4-methoxy benzophenone, 2-hydroxy benzophenone, 2-hydroxy-4-octoxy benzophenone, 2,2'-dihydroxy-4,4'-dimethoxy benzophenone and the like.

When the inventive undercoating composition is formulated with these benzophenone compounds, the undercoating layer formed therewith is imparted with a particularly decreased transmissivity to the ultraviolet light having a wavelength of around 365 nm such as the i-line light so as to give quite satisfactory reproducibility of the resist pattern with a high selectivity ratio.

Examples of the compounds represented by the above given general formula (I), in which the divalent group X is —SO$_2$—, include bis(2,4-dihydroxyphenyl) sulfone, bis(3,4-dihydroxyphenyl) sulfone, bis(3,5-dihydroxyphenyl) sulfone, bis(3,6-dihydroxyphenyl) sulfone, bis(4-hydroxyphenyl) sulfone, bis(3-hydroxyphenyl) sulfone, bis(2-hydroxyphenyl) sulfone, bis(3,5-dimethyl-4-hydroxyphenyl) sulfone and the like.

Examples of the compounds represented by the above given general formula (I), in which the divalent group X is —SO—, include bis(2,3-dihydroxyphenyl) sulfoxide, bis(5-chloro-2,3-dihydroxyphenyl) sulfoxide, bis(2,4-dihydroxyphenyl) sulfoxide, bis(2,4-dihydroxy-6-methylphenyl) sulfoxide, bis(5-chloro-2,4-dihydroxyphenyl) sulfoxide, bis(2,5-dihydroxyphenyl) sulfoxide, bis(3,4-dihydroxyphenyl) sulfoxide, bis(3,5-dihydroxyphenyl) sulfoxide, bis(2,3,4-trihydroxyphenyl) sulfoxide, bis(2,3,4-trihydroxy-6-methyl-phenyl) sulfoxide, bis(5-chloro-2,3,4-trihydroxyphenyl) sulfoxide, bis(2,4,6-trihydroxyphenyl) sulfoxide, bis(5-chloro-2,4,6-trihydroxyphenyl) sulfoxide and the like.

When the inventive undercoating composition is formulated with these diphenyl sulfone or sulfoxide compounds, the undercoating layer is imparted with a particularly decreased transmissivity to deep ultraviolet light having a wavelength of, for example, 248 nm so as to give quite satisfactory reproducibility of the resist pattern along with a high selectivity ratio.

Among the above named benzophenone, diphenyl sulfone and diphenyl sulfoxide compounds, particularly preferable are those having a symmetrical molecular structure and having one or more hydroxy groups at each of the p-positions relative to the group X such as 2,2',4,4'-tetrahydroxy benzophenone, bis(2,4-dihydroxyphenyl) sulfone, bis(4-hydroxyphenyl) sulfone, bis(3,5-dimethyl-4-hydroxyphenyl) sulfone, bis(2,4-dihydroxyphenyl) sulfoxide, bis(2,4-dihydroxy-6-methylphenyl) sulfoxide, bis(5-chloro-2,4-dihydroxyphenyl) sulfoxide, bis(2,3,4-trihydroxyphenyl) sulfoxide and the like in respect of the good crosslinkability of the composition. More preferable are 2,2',4,4'-tetrahydroxy benzophenone, bis(4-hydroxyphenyl) sulfone and bis(2,4-dihydroxyphenyl) sulfoxide in respect of absence of the phenomenon of intermixing between layers in addition to the good crosslinkability of the composition. These compounds can be used either singly or as a combination of two kinds or more according to need.

The alkali-insoluble acrylic resin as the component (c), which is an optional ingredient in the inventive undercoating composition, is a homo- or copolymer obtained by the polymerization of an acrylic monomer or a mixture of monomers selected from the group consisting of glycidyl (meth)acrylates, such as glycidyl acrylate and glycidyl methacrylate, and alkyl (meth)acrylates, such as methyl (meth)acrylate, ethyl (meth)acrylate and propyl (meth)acrylate. Namely, the acrylic resin includes polyglycidyl (meth)acrylate, polymethyl (meth)acrylate, polyethyl (meth)acrylate and copolymers of glycidyl (meth)acrylate and methyl (meth)acrylate, of which particularly preferable are the copolymers of glycidyl methacrylate and methyl methacrylate in a copolymerization ratio of 2:8 to 8:2 by weight or, more preferably, 3:7 to 7:3 by weight from the standpoint of obtaining a high selectivity ratio with absence of the phenomenon of intermixing between layers. These alkali-insoluble acrylic resins should have a weight-average molecular weight in the range from 10,000 to 200,000 or, preferably, from 20,000 to 100,000.

These alkali-insoluble acrylic resins can be prepared, for example, in the following manner. Thus, a polymerization mixture is prepared by dissolving the monomer or a combination of the monomers in up to 500% by weight of an organic solvent such as ketones, e.g., acetone and methyl ethyl ketone, aromatic hydrocarbon solvents, e.g., benzene, toluene and ethyl benzene and halogenated hydrocarbon compounds, e.g., chloroform and carbon tetrachloride, with addition of a polymerization initiator such as azobisisobutyronitrile, azobisvaleronitrile, benzoyl peroxide and lauroyl peroxide in an amount of 0.05 to 0.5% by weight based on the total amount of the monomer or monomers. The polymerization mixture is heated in an atmosphere of nitrogen gas under agitation at a temperature of 50° to 80° C. for 3 to 12 hours depending on the types of the monomers and weight-average molecular weight of the desired polymer or copolymer. The thus obtained polymerization mixture after completion of the polymerization reaction is poured into a large volume of a precipitant solvent such as alcohols, e.g., methyl and ethyl alcohols, to precipitate the resin which is dried under reduced pressure.

As to the formulation of the inventive undercoating composition with the above described components (a), (b) and, optionally, (c), the amount of the component (b) is in the range from 10 to 300 parts by weight or, preferably, from 20 to 200 parts by weight per 100 parts by weight of the component (a) while the amount of the component (c), when used, is in the range from 1 to 400 parts by weight or, preferably, from 5 to 300 parts by weight per 100 parts by weight of the total amount of the components (a) and (b). When the amount of the component (b) is too small, the absorptivity of the undercoating layer to ultraviolet light cannot be as high as desired so that the undesirable phenomenon of notching may take place or the desired selectivity ratio cannot be obtained. When the amount of the component (b) is too large, on the other hand, an intermixing layer may sometimes be formed.

Needless to say, the undercoating composition of the invention is used in the form of a solution prepared by dissolving the above described components (a), (b) and, optionally, (c) in a suitable organic solvent, which is, though not particularly limitative, selected from the group consisting of ketones such as acetone, methyl ethyl ketone, cyclopentanone, cyclohexanone, methyl amyl ketone, methyl isoamyl ketone and 1,1,1-trimethyl acetone, polyhydric alcohols and derivatives thereof such as ethyleneglycol, ethyleneglycol monoacetate, diethyleneglycol, diethyleneglycol monoacetate, propyleneglycol and propyleneglycol monoacetate as well as monoalkyl, i.e. monomethyl, monoethyl, monopropyl, monobutyl and monophenyl ethers thereof, cyclic ethers such as dioxane and esters such as ethyl lactate, methyl acetate, ethyl acetate, butyl acetate, methyl piruvate, ethyl piruvate, methyl 3-methoxypropionate and ethyl 3-ethoxypropionate. These organic solvents can be used either singly or as a mixture of two kinds or more according to need.

It is further optional that the undercoating composition of the invention is further admixed according to need with various kinds of known additives having compatibility with the other ingredients including, for example, an organic acid which acts as a promoter for the crosslinking reaction of the crosslinkable functional groups in the component (a) such as acetic acid, oxalic acid, maleic acid, o-hydroxy benzoic acid, 3,5-dinitro benzoic acid and 2,6-dihydroxy benzoic acid as well as a specific polymer acid sold under the tradename of SAX, which consists of the monomeric units of o-hydroxybenzoic acid-p-xylylene (a product by Mitsui Toatsu Chemical Co.) in an amount in the range up to 5% by weight based on the total amount of the components (a), (b) and, when used, (c) in the composition.

It is sometimes advantageous that the undercoating composition of the invention is admixed with a surface active agent with an object to improve the workability of coating with the composition and to prevent striation in the coating layer in an amount in the range up to 2000 ppm by weight based on the total amount of the components (a), (b) and, when used, (c) in the composition. Various grades of commercially available surface active agents can be used for this purpose including fluorocarbon-based ones sold under the tradenames of Surflons SC-103 and SR-100 (each a product by Asahi Glass Co.), EF-351 (a product by Tohoku Fertilizers), Fluorads Fc-431, Fc-135, Fc-98, Fc-430 and Fc-176 (each a product by Sumitomo 3M Co.) and the like.

The photoresist composition, from which a photosensitive overcoating layer is formed on the undercoating layer of the inventive undercoating composition, is not particularly limitative including negative-working and positive-working ones. The positive-working photoresist composition includes those a naphthoquinone diazide compound and a novolac resin, those comprising an alkali-soluble resin, a compound capable of generating an acid by exposure to light and a compound capable of being decomposed in the presence of an acid and imparted with enhanced solubility in an aqueous alkaline solution, those comprising an alkali-soluble resin having functional groups capable of being decomposed in the presence of an acid and imparting the resin with increased solubility in an aqueous alkaline solution and a compound capable of generating an acid by exposure to light and the like. The negative-working photoresist compositions include those comprising a compound capable of generating an acid by exposure to light, crosslinking agent and alkali-soluble resin.

In conducting the photolithographic patterning work by using the undercoating composition of the invention and a photoresist composition such as those described above, a substrate such as a semiconductor silicon wafer is first coated with the undercoating composition in the form of a solution on a suitable coating machine such as spinners followed by baking at a temperature of 100° to 300° C. to form a dried undercoating layer having a thickness of 0.05 to 0.3 µm, on which a photoresist layer is formed by coating with a photoresist composition also in the form of a solution by using a spinner and the like followed by drying. The above mentioned baking temperature is sufficiently high to effect the crosslinking reaction in the undercoating layer so that the undercoating layer is rendered insoluble in an aqueous alkaline solution and can be less liable to the occurrence of the undesirable phenomenon of intermixing with the overcoating layer of the photoresist composition. It is of course that the above mentioned baking treatment can be replaced with an irradiation treatment with actinic rays such as ultraviolet light to obtain similar crosslinking effects.

In the next place, the thus formed overcoating photoresist layer is exposed patternwise to ultraviolet light emitted from a suitable light source such as low-pressure, high-pressure and ultrahigh-pressure mercury lamps, arc lamps, xenon lamps, excimer lasers and the like through a desired patterned photomask or irradiated with electron beams scanned patternwise so that a latent image of the pattern is formed in the photoresist layer which is developed by a development treatment with an aqueous alkaline solution such as an aqueous solution of tetramethyl ammonium hydroxide in a concentration of 1 to 10% by weight so as to dissolve away the photoresist layer patternwise in the unexposed areas, when the photoresist composition is of the negative-working type, or in the exposed areas, when the photoresist composition is of the positive-working type, leaving a patterned resist layer having good fidelity to the mask pattern so as to have the undercoating layer exposed bare patternwise.

In the next place, a dry etching treatment is undertaken by using, for example, chlorine gas as an etching gas so as to remove the patternwise exposed undercoating layer with the patterned resist layer as a mask against etching. In this etching treatment, it is desirable that the undercoating layer is removed as completely as possible while the overcoating resist layer is left intact against etching or, in other words, the selectivity ratio is as high as possible. It is a known procedure in order to enhance the selectivity ratio that the patterned resist layer is silylated in order to be imparted with increased resistance against etching. The above mentioned silylation treatment is performed, though not particularly limitative, by exposing the patterned resist layer to the vapor of a silylating agent such as hexamethyl disilazane, hexamethyl cyclotrisilazane and the like at a temperature of 30° to 100° C. for 1 to 60 minutes.

As is understood from the above given description, the undercoating composition of the invention has very high thermal crosslinkability and is free from the troubles due to intermixing with the overcoating photoresist layer. By virtue of the high absorptivity to the reflecting light from the substrate surface, a quite excellent patterned resist layer having high fidelity to the mask pattern and orthogonal cross sectional profile can be obtained without notching and with a high selectivity.

In the following, the undercoating composition of the invention is described in more detail by way of examples as preceded by the description of the preparation procedures of the respective undercoating compositions used in the evaluation tests.

Preparation 1.

An undercoating composition in the form of a solution was prepared by dissolving 100 g of a melamine compound substituted by methoxymethylol groups in an average number of 3.7 per triazine ring (Mx-750, a product by Sanwa Chemical Co.), 100 g of 2,2',4,4'-tetrahydroxy benzophenone and a fluorocarbon-type surface active agent (Fc-430, a product by Sumitomo 3M Co.) in an amount of 1000 ppm by weight based on the total amount of the melamine compound and the benzophenone compound in 2700 g of propyleneglycol monomethyl ether acetate followed by filtration of the solution through a membrane filter having a pore diameter of 0.2 µm.

Preparation 2.

A glycidyl group-containing copolymeric resin was prepared by heating a solution prepared by dissolving 100 g of glycidyl methacrylate and 100 g of methyl methacrylate in 200 g of methyl ethyl ketone with admixture of 2 g of azobisisobutyronitrile at 60° C. for about 7 hours under agitation in an atmosphere of nitrogen gas. The polymerization mixture after completion of the polymerization reaction was poured into 1 liter of methyl alcohol to precipitate the copolymeric resin which was dried at room temperature under reduced pressure to obtain 150 g of the dried copolymeric resin which had a weight-average molecular weight of about 60,000.

An undercoating composition in the form of a solution was prepared by dissolving 91 g of the above obtained copolymeric resin, 27.2 g of a melamine compound substituted by methoxymethylol groups in an average number of 5.8 per triazine ring (Mw-30, a product by Sanwa Chemical Co.), 72.8 g of 2,2',4,4'-tetrahydroxy benzophenone, 9.0 g of SAX (a product by Mitsui-Toatsu Chemical Co.) and a fluorocarbontype surface active agent (Fc-430, a product by Sumitomo 3M Co.) in an amount of 1000 ppm by weight based on the total amount of the other solid ingredients in 2600 g of propyleneglycol monomethyl ether acetate followed by filtration of the solution through a membrane filter having a pore diameter of 0.2 μm.

Preparation 3.

An undercoating composition in the form of a solution was prepared by dissolving 100 g of the same copolymeric resin as prepared and used in Preparation 2, 80 g of 2,2',4,4'-tetrahydroxy benzophenone and a fluorocarbon-type surface active agent (Fc-430, a product by Sumitomo 3M Co.) in an amount of 1000 ppm by weight based on the total amount of the other solid ingredients in 2400 g of propyleneglycol mono-methyl ether acetate followed by filtration of the solution through a membrane filter having a pore diameter of 0.2 μm.

Preparation 4.

An undercoating composition in the form of a solution was prepared by dissolving 100 g of the same copolymeric resin as prepared and used in Preparation 2, 30 g of 2,2',4,4'-tetrahydroxy benzophenone and a fluorocarbon-type surface active agent (Fc-430, a product by Sumitomo 3M Co.) in an amount of 1000 ppm by weight based on the total amount of the other solid ingredients in 2400 g of propyleneglycol monomethyl ether acetate followed by filtration of the solution through a membrane filter having a pore diameter of 0.2 μm.

Preparation 5.

An undercoating composition in the form of a solution was prepared by dissolving 5 g of a melamine compound substituted by methoxymethylol groups in an average number of 3.7 per triazine ring (Mx-750, a product by Sanwa Chemical Co.), 5 g of bis(4-hydroxyphenyl) sulfone and a fluorocarbon-type surface active agent (Fc-430, a product by Sumitomo 3M Co.) in an amount of 1000 ppm by weight based on the total amount of the above mentioned two ingredients in 90 g of propyleneglycol monomethyl ether acetate followed by filtration of the solution through a membrane filter having a pore diameter of 0.2 μm.

Preparation 6.

An undercoating composition in the form of a solution was prepared by dissolving 5 g of a melamine compound substituted by methoxymethylol groups in an average number of 3.7 per triazine ring (Mx-750, a product by Sanwa Chemical Co.), 5 g of bis(2,4-dihydroxyphenyl) sulfoxide and a fluorocarbon-type surface active agent (Fc-430, a product by Sumitomo 3M Co.) in an amount of 1000 ppm by weight based on the total amount of the above mentioned two ingredients in 90 g of propyleneglycol monomethyl ether acetate followed by filtration of the solution through a membrane filter having a pore diameter of 0.2 μm.

Preparation 7.

According to the disclosure in Japanese Patent Kokai 6-118631, an reflection-preventing undercoating composition in the form of solution was prepared by dissolving 5 g of a phenol novolac resin obtained by the condensation reaction of phenol and formaldehyde in the presence of an acid catalyst and having a weight-average molecular weight of 5000, 2.5 g of hexamethoxymethyl melamine (Mw-30HM, a product by Sanwa Chemical Co.) and a fluorocarbon-type surface active agent (Fc-430, a product by Sumitomo 3M Co.) in an amount of 1000 ppm by weight based on the total amount of the above mentioned two ingredients in 70 g of propyleneglycol monomethyl ether acetate followed by filtration of the solution through a membrane filter having a pore diameter of 0.2 μm.

EXAMPLE 1.

A semiconductor silicon wafer was coated on a spinner with the undercoating composition in the form of a solution obtained in Preparation 1 followed by drying at 90° C. for 90 seconds and baking at 180° C. for 5 minutes to form an undercoating layer having a thickness of about 0.15 μm, which was then overcoated with a commercial product of a positive-working photoresist composition mainly consisting of a novolac resin and a naphthoquinone diazide compound (TSMR-iP3300, a product by Tokyo Ohka Kogyo Co.) on a spinner followed by baking at 90° C. for 90 seconds to form a photoresist layer having a thickness of 1.00 μm.

The thus formed photoresist layer was exposed pattern-wise through a photomask of a line-and-space pattern of 0.40 μm width on an exposure machine (NSR-1755i9C manufactured by Nikon Co.) and subjected to post-exposure baking at 110° C. for 90 seconds followed by a development treatment in a 2.38% by weight aqueous solution of tetramethyl ammonium hydroxide at 23° C. for 65 seconds followed by drying to give a patterned resist layer.

In the next place, the silicon wafer bearing the undercoating layer and the patterned resist layer was subjected to dry etching in the plasma chamber of a plasma etching machine (TUE-1102 manufactured by Tokyo Ohka Kogyo Co.) with chlorine gas as the etching gas under a pressure of 30 mTorr at a temperature of 20° C. with supply of an electric power of 150 watts. The selectivity ratio in this etching treatment was 1.91. The results of testing for the other items were quite satisfactory and recorded as good including the tests for intermixing between layers, notching and cross sectional profile of the patterned resist layer. The testing procedures for these items were as described below.

(1) Selectivity ratio:

Recording was made of the ratio of the etching rate of the undercoating layer after drying to the etching rate of the patterned resist layer under the etching conditions described above.

(2) Intermixing of layers:

A cross section of the sample was examined on a scanning electron microscope to detect occurrence of any intermixing layer. The results were recorded as good when no intermixing layer was detected and as poor when an intermixing layer was detected between layers.

(3) Notching:

The sample having a stepped surface with level difference after the exposure to light, post-exposure baking, development and dry etching was microscopically examined to detect deformation of several parallel lines of the patterned resist layer. The results were recorded as good when no deformation was found and as poor when deformation was found in each of the parallel lines.

(4) Cross sectional profile of line pattern:

A cross section of the sample was examined on a scanning electron microscope and the results were recorded as good when the cross section had an orthogonal profile without trailing skirts and as poor when the cross sectional profile had trailing skirts.

EXAMPLE 2.

The experimental procedure was substantially the same as in Example 1 excepting replacement of the undercoating composition with that obtained in Preparation 2. The selectivity ratio was 3.10 and the result in each of the other testing items was good.

Comparative Example 1.

The experimental procedure was substantially the same as in Example 1 excepting replacement of the undercoating composition with that obtained in Preparation 3. The selectivity ratio was 2.40 but the result in each of the other testing items was poor.

Comparative Example 2.

The experimental procedure was substantially the same as in Example 1 excepting replacement of the undercoating composition with that obtained in Preparation 4. The selectivity ratio was 2.51 but the results of testing for the other testing items were good for intermixing but poor for notching and cross sectional profile.

EXAMPLE 3.

A semiconductor silicon wafer was coated on a spinner with the undercoating composition in the form of a solution obtained in Preparation 1 followed by drying at 90° C. for 90 seconds and baking at 180° C. for 5 minutes to form an undercoating layer having a thickness of about 0.15 µm, which was then overcoated with a commercial product of a negative-working photoresist composition mainly consisting of an alkali-soluble resin, crosslinking agent and acid-generating agent (THMR-iN200, a product by Tokyo Ohka Kogyo Co.) on a spinner followed by baking at 110° C. for 90 seconds to form a photoresist layer having a thickness of 1.00 µm.

The thus formed photoresist layer was exposed patternwise through a photomask of a line-and-space pattern of 0.40 µm width on an exposure machine (NSR-1755i9C manufactured by Nikon Co.) and subjected to post-exposure baking at 100° C. for 90 seconds followed by a development treatment in a 2.38% by weight aqueous solution of tetramethyl ammonium hydroxide at 23 ° C. for 65 seconds to give a patterned resist layer.

The dry etching of the thus obtained silicon wafer bearing the undercoating layer and patterned resist layer was performed in the same manner as in Example 1. The selectivity ratio in this dry etching was 1.56 and the result in each of the other testing items was good.

EXAMPLE 4.

The experimental procedure was substantially the same as in Example 3 excepting replacement of the undercoating composition with that obtained in Preparation 2. The selectivity ratio was 2.53 and the result in each of the other testing items was good.

Comparative Example 3.

The experimental procedure was substantially the same as in Example 3 excepting replacement of the undercoating composition with that obtained in Preparation 3. The selectivity ratio was 1.95 but the result in each of the other testing items was poor.

Comparative Example 4.

The experimental procedure was substantially the same as in Example 3 excepting replacement of the undercoating composition with that obtained in Preparation 4. The selectivity ratio was 2.05 but the results of testing for the other testing items were good for intermixing but poor for notching and cross sectional profile.

EXAMPLE 5.

A semiconductor silicon wafer was coated on a spinner with the undercoating composition in the form of a solution obtained in Preparation 5 followed by drying at 90° C. for 90 seconds and baking at 180° C. for 90 seconds to form an undercoating layer having a thickness of about 0.1 µm, which was then overcoated with a commercial product of a positive-working photoresist composition of the chemical amplificationtype mainly consisting of a polyhydroxystyrene substituted by functional groups capable of being decomposed in the presence of an acid and imparting the resin with increased solubility in an aqueous alkaline solution and a compound capable of generating an acid by exposure to light on a spinner followed by baking at 90° C. for 90 seconds to form a photoresist layer having a thickness of 0.7 µm.

The thus formed photoresist layer was exposed patternwise through a photomask of a line-and-space pattern on an exposure machine (NSR2005Ex8A with a numerical aperture of 0.5 manufactured by Nikon Co.) and subjected to post-exposure baking at 110° C. for 90 seconds followed by a development treatment in a 2.38% by weight aqueous solution of tetramethyl ammonium hydroxide at 23° C. for 65 seconds to give a patterned resist layer. The cross sectional profile of the thus formed line-and-space patterned resist layer having a width of 0.3 µm was orthogonal.

The dry etching of the thus obtained silicon wafer bearing the undercoating layer and patterned resist layer was performed in the same manner as in Example 1. The selectivity ratio in the dry etching was 2.0 and the result in each of the other testing items was good.

EXAMPLE 6.

The experimental procedure was substantially the same as in Example 5 excepting replacement of the undercoating composition with that obtained in Preparation 6. The selectivity ratio was 2.0 and the result in each of the other testing items was good. The cross sectional profile of the line pattern was orthogonal even in the line of 0.3 µm width.

Comparative Example 5.

The experimental procedure was substantially the same as in Example 5 excepting replacement of the undercoating composition with a commercial product of which the resinous ingredient was a polysulfone resin (CD-7, a product by Brewer Science Co.). The result of the test development treatment was that no resolution could be obtained in a line-and-space pattern of 0.4 μm width and undercutting was found at the bottom of the patterned resist layer with sideway falling of the patterned resist layer in some places so that the dry etching treatment could not be undertaken.

Comparative Example 6.

The experimental procedure was substantially the same as in Example 5 excepting replacement of the undercoating composition with that obtained in Preparation 7. The result of the test development treatment was that intermixing was found between layers and the cross sectional profile of the line-patterned resist layer had trailing skirts so that no dry etching was undertaken.

Comparative Example 7.

The experimental procedure was substantially the same as in Example 5 excepting replacement of the undercoating composition with that obtained in Preparation 7 and modification of the conditions for the baking treatment of the undercoating layer to 5 minutes at 300° C. The selectivity ratio was as small as 1.0 although the result of testing for each of the other testing items was good.

What is claimed is:

1. An undercoating composition for photolithography which consists essentially of, in the form of a uniform solution in an organic solvent:

(a) a triazine compound having, in a molecule, at least two functional groups capable of forming crosslinking selected from the group consisting of hydroxy group and alkoxy groups; and (b) an ultraviolet-absorbing compound represented by the formula

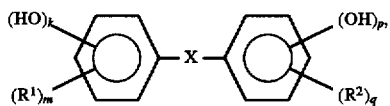

in which X is a divalent group selected from the group consisting of —CO—, —SO— and —SO$_2$—, $R^1$ and $R^2$ are, each independently from the other, a hydrogen atom, halogen atom, alkyl group having 1 to 4 carbon atoms or alkoxy group having 1 to 8 carbon atoms, the subscripts k, m and q are each an integer of 1, 2 or 3 and the subscript p is 0, 1, 2 or 3 with the proviso that k+m and p+q each do not exceed 5.

2. The undercoating composition as claimed in claim 1 which further comprises:

(c) an alkali-insoluble resin which is a polymer of a (meth)acrylic acid ester or a combination of (meth)acrylic acid esters.

3. The undercoating composition as claimed in claim 1 in which the triazine compound as the component (a) is a melamine compound or a guanamine compound represented by the formula

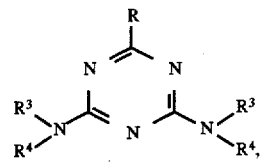

in which $R^3$ and $R^4$ are each, independently from the others, a hydrogen atom, methylol group or alkoxymethyl group and R is a hydrogen atom, alkyl group, aralkyl group, aryl group or —NR$^3$R$^4$, at lest two of the groups denoted by $R^3$ and $R^4$ in a molecule being methylol groups or alkoxymethyl groups.

4. The undercoating composition as claimed in claim 1 in which the component (b) is selected from the group consisting of 2,2',4,4'-tetrahydroxy benzophenone, bis(4-hydroxyphenyl) sulfone and bis(2,4-dihydroxyphenyl) sulfoxide.

5. The undercoating composition as claimed in claim 2 in which the component (c) is a copolymer of glycidyl methacrylate and methyl methacrylate in a copolymerization ratio in the range from 2:8 to 8:2 by weight.

6. The undercoating composition as claimed in claim 5 in which the component (c) has a weight-average molecular weight in the range from 10,000 to 200,000.

7. The undercoating composition as claimed in claim 1 in which the amount of the component (b) is in the range from 10 to 300 parts by weight per 100 parts by weight of the component (a).

8. The undercoating composition as claimed in claim 2 in which the amount of the component (c) is in the range from 1 to 400 parts by weight per 100 parts by weight of the total amount of the components (a) and (b).

* * * * *